(12) United States Patent
Ein-Eli et al.

(10) Patent No.: US 7,964,005 B2
(45) Date of Patent: Jun. 21, 2011

(54) COPPER CMP SLURRY COMPOSITION

(75) Inventors: Yair Ein-Eli, Haifa (IL); David Starosvetsky, Yokneam Ilit (IL); Esta Abelev, Kiryat-Yam (IL); Eugene Rabkin, Haifa (IL)

(73) Assignee: Technion Research & Development Foundation Ltd., Haifa (IL)

( * ) Notice: Subject to any disclaimer, the term of this patent is extended or adjusted under 35 U.S.C. 154(b) by 657 days.

(21) Appl. No.: 10/551,714

(22) PCT Filed: Apr. 4, 2004

(86) PCT No.: PCT/IL2004/000310
§ 371 (c)(1),
(2), (4) Date: Jul. 20, 2006

(87) PCT Pub. No.: WO2004/090937
PCT Pub. Date: Oct. 21, 2004

(65) Prior Publication Data
US 2007/0163677 A1    Jul. 19, 2007

Related U.S. Application Data

(60) Provisional application No. 60/461,437, filed on Apr. 10, 2003.

(51) Int. Cl.
*B24D 3/02* (2006.01)
*C09C 1/68* (2006.01)
*C09K 3/14* (2006.01)
*C09G 1/02* (2006.01)

(52) U.S. Cl. .............................. 51/307; 106/3

(58) Field of Classification Search .................. 106/403, 106/290, 308, 404, 31.9, 3; 156/659; 523/200; 51/294–297, 307
See application file for complete search history.

(56) References Cited

U.S. PATENT DOCUMENTS

| | | |
|---|---|---|
| 4,632,727 A | 12/1986 | Nelson |
| 4,671,851 A | 6/1987 | Beyer et al. |
| 4,789,648 A | 12/1988 | Chow et al. |
| 4,910,155 A | 3/1990 | Cote et al. |
| 4,944,836 A | 7/1990 | Beyer et al. |
| 4,954,142 A | 9/1990 | Carr et al. |
| 4,956,313 A | 9/1990 | Cote et al. |
| 5,137,544 A | 8/1992 | Medellin |
| 5,157,876 A | 10/1992 | Medellin |

(Continued)

FOREIGN PATENT DOCUMENTS

EP     1096556     5/2001

(Continued)

OTHER PUBLICATIONS

Chan et al. "Oxide Film Formation and Oxigen Adsorption on Copper in Aqueous Media as Probed by Surface-Enhanced Raman Spectroscopy", Journal of Physical Chemistry, B, 103: 357-365, 1999.

(Continued)

*Primary Examiner* — Anthony J Green
*Assistant Examiner* — Pegah Parvini

(57) ABSTRACT

A composition that rapidly passivates copper-containing surface to yield a uniform layer of insoluble copper oxide, the composition being useful in chemical-mechanical planarization of copper-containing surfaces is disclosed. The composition is a solution having a pH of equal to or greater than 9 and having an oxidation potential sufficient to oxidize the surface to form non-soluble copper oxides. Also disclosed are methods of making and using the composition.

33 Claims, 9 Drawing Sheets

U.S. PATENT DOCUMENTS

| | | | |
|---|---|---|---|
| 5,209,816 A | 5/1993 | Yu et al. | |
| 5,225,034 A | 7/1993 | Yu et al. | |
| 5,245,790 A | 9/1993 | Jerbic | |
| 5,340,370 A | 8/1994 | Cadien et al. | |
| 5,354,490 A | 10/1994 | Yu et al. | |
| 5,476,606 A | 12/1995 | Brancaleoni et al. | |
| 5,527,423 A | 6/1996 | Neville et al. | |
| 5,575,837 A | 11/1996 | Kodama et al. | |
| 5,676,587 A | 10/1997 | Landers et al. | |
| 5,770,095 A | 6/1998 | Sasaki et al. | |
| 5,800,577 A | 9/1998 | Kido | |
| 5,840,629 A | 11/1998 | Carpio | |
| 5,897,375 A * | 4/1999 | Watts et al. | 438/693 |
| 6,126,514 A | 10/2000 | Muroyama | |
| 6,126,853 A | 10/2000 | Kaufman et al. | |
| 6,309,560 B1 | 10/2001 | Kaufman et al. | |
| 6,313,039 B1 | 11/2001 | Small et al. | |
| 6,368,955 B1 * | 4/2002 | Easter et al. | 438/633 |
| 6,383,240 B1 | 5/2002 | Nishimoto et al. | |
| 6,432,828 B2 | 8/2002 | Kaufman et al. | |
| 6,447,371 B2 * | 9/2002 | Brusic Kaufman et al. | 451/36 |
| 6,569,350 B2 | 5/2003 | Kaufman et al. | |
| 6,589,099 B2 * | 7/2003 | Haggart et al. | 451/41 |
| 6,676,484 B2 | 1/2004 | Chopra | |
| 6,831,015 B1 | 12/2004 | Inoue et al. | |
| 2001/0051433 A1 * | 12/2001 | Francis et al. | 438/691 |
| 2002/0017064 A1 * | 2/2002 | Shimazu et al. | 51/309 |
| 2002/0066234 A1 | 6/2002 | Cote et al. | |
| 2003/0153188 A1 * | 8/2003 | Shimazu et al. | 438/692 |
| 2003/0212283 A1 * | 11/2003 | Parker et al. | 549/534 |
| 2004/0144755 A1 | 7/2004 | Motonari et al. | |
| 2004/0226918 A1 | 11/2004 | Lee et al. | |
| 2005/0252092 A1 | 11/2005 | Kim et al. | |

FOREIGN PATENT DOCUMENTS

| | | |
|---|---|---|
| JP | 2006-316167 | 11/2006 |
| WO | WO 98/42790 | 10/1998 |
| WO | WO 98/42791 | 10/1998 |
| WO | WO 2005/047410 | 5/2005 |

OTHER PUBLICATIONS

Feng et al. "Corrosion Mechanisms and Products of Copper in Aqueous Solutions at Various pH Values", Corrosion, 53(5): 398-407, May 1997.

Hamilton et al. "In Situ Raman Spectroscopy of Anodic Films Formed on Copper and Silver in Sodium Hydroxide Solution", Journal of the Electrochemical Society, 139: 739-745, 1986.

Kunze et al. "In Situ Scanning Tunneling Microscopy Study of the Anodic Oxidation of Cu(111) in 0.1 M NaOH", Journal of Physical Chemistry B, 105: 4263-4269, 2001.

Maurice et al. "In Situ Scanning Tunneling Microscope Study of the Passivation of Cu(111)", Journal of the Electrochemical Society, 146(2): 524-530, 1999.

Maurice et al. "In Situ STM Study of the Initial Stages of Oxidation of Cu(111) in Aqueous Solution", Surface Science, 458: 185-194, 2000.

Mayer et al. "An In Situ Raman Spectroscopy Study of the Anodic Oxidation of Copper in Alkaline Media", Journal of Electrochemical Society, 139(2): 426-434, Feb. 1992.

Melendres et al. "In-Situ Synchrotron Far Infrared Spectroscopy of Surface Films on a Copper Electrode in Aqueous Solutions", Journal of Electroanalytical Chemistry, 449: 215-218, 1998.

Steigerwald et al. "Electrochemical Potential Measurements During the Chemical-Mechanical Polishing of Copper Thin Films", Journal of the Electrochemical Society, 142(7): 2379-2385, Jul. 1995.

Strehblow et al. "The Investigation of the Passive Behaviour of Copper in Weakly Acid and Alkaline Solutions and the Examination of the Passive Film by ESCA and ISS", Electrochimica Acta, 25: 839-850, 1980.

International Search Report Dated Nov. 16, 2004 From the International Searching Authority Re.: Application No. PCT/IL04/00310.

Written Opinion Dated Nov. 16, 2004 From the International Searching Authority Re.: Application No. PCT/IL04/00310.

Prasad et al. "Chemical Mechanical Planarization of Copper in Alkaline Slurry With Uric Acid as Inhibitor", Electrochimica Acta, 52: 6353-6358, Apr. 2007.

Response Dated Feb. 4, 2010 to Official Action of Nov. 4, 2009 From the US Patent and Trademark Office Re.: U.S. Appl. No. 10/551,714.

Abelev et al. "Enhanced Copper Surface Protection in Aqueous Solutions Containing Short-Chain Alkanoic Acid Potassium Salts", Langmuir, 23: 11281-11288, Jul. 2007.

Abelev et al. "Potassium Sobate Solutions as Copper Chemical Mechanical Planarization (CMP) Based Slurries", Electrochimica Acta, 52: 5150-5158, Sep. 2006.

Abelev et al. "Potassium Sorbate—A New Aqueous Copper Corrosion Inhibitor. Electrochemical and Spectroscopic Studies", Electrochimica Acta, 52: 1975-1982, Feb. 2007.

Abelev et al. "Reprint of 'Potassium Sorbate Solutions as Copper Chemical Mechanical Planarization (CMP) Based Slurries'", Electrochimica Acta, 53: 1021-1029, Sep. 2007.

Ein-Eli et al. "Food Preservatives Serving as Nonselective Metal and Alloy Corrosion Inhibitors", Electrochemical and Solid-State Letters, 9(1): B5-B7, Nov. 2005.

Ein-Eli et al. "Review on Copper Chemical-Mechanical Polishing (CMP) and Post-CMP Cleaning in Ultra Large System Integrated (ULSI)—An Electrochemical Perspective", Electrochimica Acta, 52: 1825-1838, Jul 2007.

Gorantla et al. "Role of Amine and Carboxyl Functional Groups of Complexing Agents in Slurries for Chemical Mechanical Polishing of Copper", Journal of The Electrochemical Society, 152(12): G912-G916, 2005.

Hariharaputhiran et al. "Hydroxyl Radical Formation in H2O2-Amino Acid Mixtures and Chemical Mechanical Planarization of Copper", Journal of The Electrochemical Society, 147(10): 3820-3826, 2000.

Patri et al. "Role of the Functional Groups of Complexing Agents in Copper Slurries", Journal of the Electrochemical Society, 153(7): G650-G659, 2006.

* cited by examiner

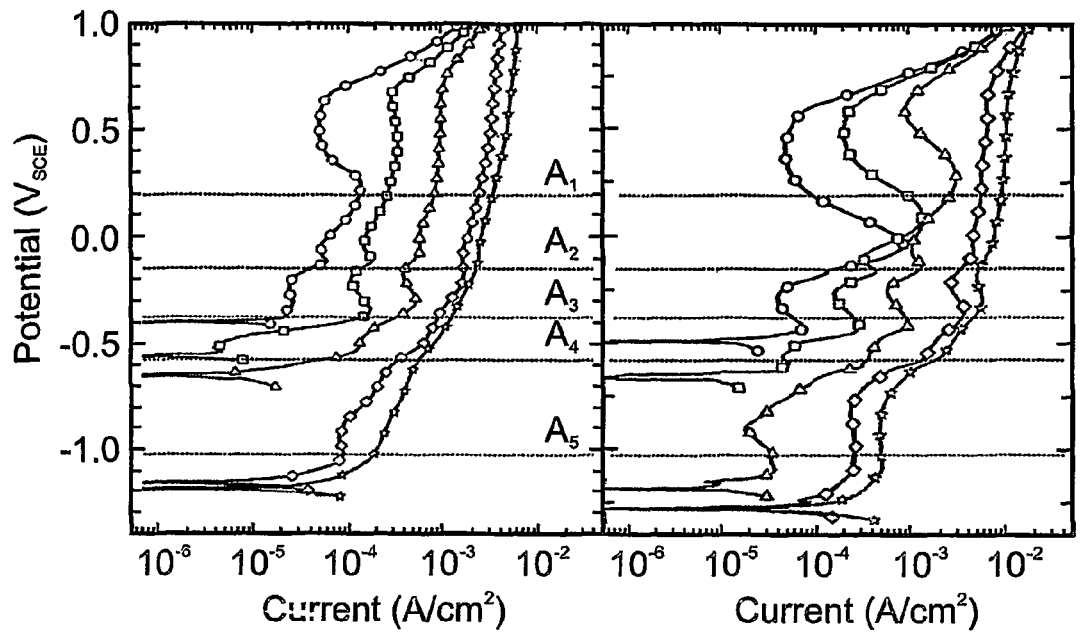
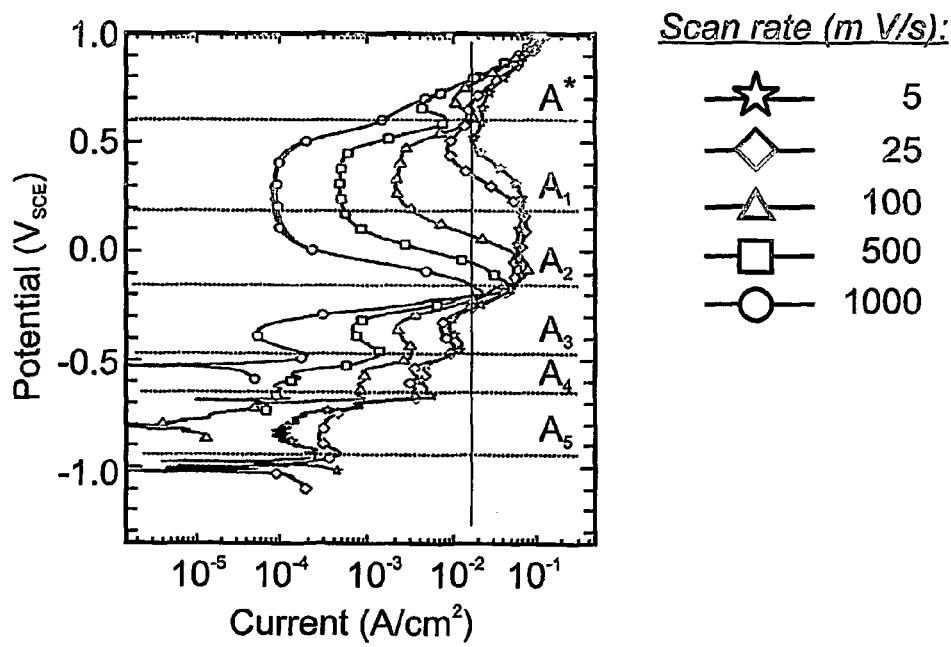
Fig. 4a Fig. 4b Fig. 4c

Polished surface

Peak A₃
-0.4 V

Peak A₁
0.3 V

COPPER CMP SLURRY COMPOSITION

RELATED PATENT APPLICATION

This application is a National Phase Application of PCT/IL2004/000310 having International Filing Date of 4 Apr. 2004, which claims the benefit of U.S. Provisional Patent Application No. 60/461,437 filed 10 Apr. 2003. The contents of the above Application are all incorporated herein by reference.

FIELD AND BACKGROUND OF THE INVENTION

The present invention relates to the field of metallurgy and specifically to a method for chemical-mechanical planarization (CMP) of copper-containing surfaces as well as a slurry composition useful for CMP.

In the manufacture of integrated circuits it is common to connect the various components with a network of thin planar wiring (also called interconnects) so as to reduce circuit volume and thus increase component density, for example, as is necessary in submicron multilevel microelectronics. Copper, due to its low resistivity and high electromigration resistance, is one of the best materials from which to manufacture planar interconnects.

The copper damascene process is the preferred method for the production of copper interconnects. In the copper damascene process the required pattern of interconnects is made on a dielectric substrate such as a silicon wafer, copper is deposited onto the pattern (e.g. by electroplating deposition) and thereafter planarized. Due to the fact that copper is a soft metal without a protective native oxide, mechanical planarization techniques give poor results, often resulting in uneven surfaces, generating internal stress or even cracking the interconnects.

Compared to purely mechanical planarization, significantly better results are obtained by planarization of copper interconnects using chemical-mechanical polishing (CMP). CMP is substantially abrasion of a copper surface in the presence of an oxidizing composition and fine particulate abrasives, together making a slurry. In CMP, a copper surface to be polished is held against a mechanical polishing device (often a rotating polishing wheel) while being immersed in the slurry. By a combination of mechanical abrasion and chemical oxidation, thin layers of copper are removed. A detailed background of CMP can be found in, for example, U.S. Pat. Nos. 4,671,851; 4,910,155; 4,944,836; 5,676,587; 5,840,629 and 6,126,853.

Conceptually, CMP can be considered a two-step process. In a first step, a layer of bare copper metal is oxidized by oxidizing agents in the slurry. In a second step, the oxidized layer is removed by the mechanical action of the fine abrasive particles in the slurry, leading to a net removal of copper. An advantage of CMP is that since only an oxide layer is abraded, no mechanical stress is applied to the bulk of the copper. Further, areas that are not to be abraded are coated with a protective oxide layer.

An ideal CMP process is a process whereby copper metal is removed only through conversion to oxide and subsequent abrasion. As a result, the efficiency and efficacy of a CMP process are in a large part determined by the reactivity of the slurry. An ideal slurry is preferably fast-acting, quickly oxidizing newly exposed copper both to protect the surface and to generate a new oxide layer to be removed.

Ideally, copper is removed only by formation of an oxide, which in turn is removed only by abrasion. When either oxide or metal are soluble in the slurry, pitting and uneven planarization result. Therefore, a copper CMP slurry is preferably configured so that neither copper metal nor a produced copper oxide is soluble therein.

It is known that copper is soluble in acidic solutions. Despite this, acidic slurries are often used in CMP of copper based on the belief that the slurry passivates the copper, that is, oxidation occurs so quickly that dissolution of copper metal is not significant. Such slurries give less than ideal results.

It has been proposed to inhibit copper dissolution in acidic solutions by non-native passivation, that is the addition of reagents such as benzotriazole, that form a passivating film on exposed copper metal, see for example, U.S. Pat. Nos. 6,569,350 and 5,770,095. The rate of formation of such non-native passivation films has been found to be too slow to be effective during the rapid surface abrasion conditions of CMP.

A number of methods using non-acidic slurries have been proposed for the CMP of copper.

Neutral or mildly basic slurries having a pH of up to about 9 have been disclosed, including U.S. Pat. Nos. 5,770,095, 5,800,577 and 5,840,629.

U.S. Pat. Nos. 6,126,853, 6,309,560 and 6,569,350 teach compositions having a preferred pH of up to 8 and including a film-forming agent. U.S. Pat. No. 6,432,828 teaches a related composition having a preferred pH of up to 8 but devoid of a film-forming agent. Mentioned in passing in all these patents is that the pH of the slurries can be raised up to 9 or even 12, but such high pH ranges are not actually taught. Further, in these slurries the use of metal ions in the slurry composition is expressly forbidden.

A few compositions more basic than pH 9 have also been discussed in the art. An ammonium hydroxide containing slurry with a pH of between 11 and 12 has been proposed (Streigerwald et al., J. Electrochem. Soc. 142 (1995) p. 2379). A slurry for the CMP of copper having a pH greater than or equal to 7, a copper oxidizing agent and ammonia as a copper complexing agent is taught in U.S. Pat. No. 6,676,484. In these slurries, copper is oxidized to form soluble ammonium salts (e.g. $Cu(NH_3)_2$) which are then dissolved by the slurry, in a manner analogous to the removal of copper metal by acidic slurries with the same disadvantages.

It would be highly advantageous to have a slurry composition suitable for use in chemical-mechanical planarization of copper and copper alloys not having the disadvantages of prior art.

SUMMARY OF THE INVENTION

The above and other objectives are achieved by the teachings of the present invention.

The teachings of the present invention provide a composition useful for the formation of a passivating layer on a copper-containing surface. The teachings of the present invention also provide a method for making the composition and uses of the composition. As used herein, a passivating layer is a layer of copper oxides that is substantially insoluble in the composition itself. As used herein a copper-containing surface is a surface of a metal or a metal alloy that contains more than about 5%, more than 10%, more than 20%, more than 40%, more than 50% or more than 80% copper by weight.

As is clear to one skilled in the art, a composition of the present invention is useful, for example, as a slurry in the CMP of a copper-containing surface.

According to the teachings of the present invention there is provided a composition useful for the formation of a passivating layer on a copper-containing surface, the solution having a pH equal to or greater than about 9 and having an oxidation potential sufficient to oxidize the surface to form copper oxides, wherein neither copper nor the formed copper oxides are substantially soluble in the composition. Preferably, the pH of the solution is no greater than about 13.

According to the teachings of the present invention there is also provided for the use of a composition of the present invention for forming a passivating layer on a copper-containing surface.

According to the teachings of the present invention there is also provided a method of forming a passivating layer on a copper-containing surface, by contacting the surface with a composition of the present invention.

According to the teachings of the present invention there is also provided a method for planarizing a copper-containing surface, by abrading the surface in the presence of a composition of the present invention.

According to a feature of the present invention, a sufficient oxidation potential is an oxidation potential that is more positive than about $P_{pH}$ volt relative to a saturated calomel reference electrode, where:

$$P_{pH} = -0.05 \times pH + 0.425$$

And where pH is the pH of the composition.

In one embodiment of the present invention, when the pH of a solution is between 9 and 10, a sufficient oxidation potential is an oxidation potential that is more positive than about −0.05 volt relative to a saturated calomel reference electrode.

In another embodiment of the present invention, when the pH of a solution is between 10 and 11, a sufficient oxidation potential is an oxidation potential that is more positive than about −0.1 volt relative to a saturated calomel reference electrode.

In another embodiment of the present invention, when the pH of a solution is between 11 and 12, a sufficient oxidation potential is an oxidation potential that is more positive than about −0.15 volt relative to a saturated calomel reference electrode.

In another embodiment of the present invention, when the pH of a solution is between 12 and 13, a sufficient oxidation potential is an oxidation potential that is more positive than about −0.2 volt relative to a saturated calomel reference electrode.

In other embodiments of the present invention, a sufficient oxidation potential is an oxidation potential that is more positive than about −0.2V, −0.15V, −0.10V, −0.05V, 0.0V, 0.05V, 0.10V, 0.15V, 0.20V, 0.25V, 0.3V, 0.35V, 0.40V, 0.45V, 0.50V, 0.55V, 0.60V, 0.65V or 0.7V relative to a saturated calomel reference electrode. In an embodiment of the present invention, the oxidation potential is more positive than a saturated calomel reference electrode by an oxidation potential of at least 0.0V due to a general improvement in the structure and other properties of the oxide layer.

In a particular embodiment of the present invention, a composition includes a) a cation selected from the group of alkaline metal cations and alkaline earth metal cations and b) an anion of a weak acid.

Cations suitable in formulating a composition of the present invention include $Li^+$, $Na^+$, $K^+$, $Rb^+$, $Cs^+$, $Be^{2+}$, $Mg^{2+}$, $Ca^{2+}$, $Sr^{2+}$ and $Ba^{2+}$.

Anions suitable in formulating a composition of the present invention include anions of weak acids, such as acids having a $pK_a$ of greater than about 0. Suitable anions include, but are not limited to anions chosen from the amongst acetate, adipate, bicarbonate, bisulfate, carbonate, chloroacetate, citrate, crotonoate, cyanate, glutarate, dihydrogen phosphate, hydrogen phosphate, hydrogen sulfate, hydroxide, d-lactate, l-lactate, d-malate, l-malate, maleate, d-mandelate, l-mandelate, malonate, oxalate, permanganate, phosphate, hydrogen phthalate, phthalate, propanoate, succinate, sulfanilate, sulfate, d-tartarate and l-tartarate.

In a preferred embodiment of the present invention, the cation is $K^+$ and the anion is carbonate. In another preferred embodiment of the present invention, the cation is $Cs^+$ and the anion is carbonate.

According to a feature of the present invention, a composition of the present invention also includes an oxidizing agent. Suitable oxidizing agents include but are not limited to phenols, peroxides, permanganates, chromates, iodates, iron salts, aluminum salts, sodium salts, potassium salts, phosphonium salts, chlorates, perchlorates, persulfates and mixtures thereof. Examples of suitable oxidizing agents include phenol, $KIO_3$, $KBrO_3$, $K_3Fe(CN)_6$, $K_2Cr_2O_7$, $V_2O_3$, $H_2O_2$, HOCl, KOCl and $KMgO_4$ and in particular $KMnO_4$.

The teachings of the present invention provide a method for passivating a copper surface by the formation of oxides so there is no need for non-native passivation. Therefore, according to a feature of the present invention, a composition of the present invention is substantially devoid of a film-forming agent as defined in U.S. Pat. Nos. 5,770,095 and 6,569,350 and including cyclic compounds such as azole, triazole, imidazole, benzotriazole, benzimidazole and benzothiazole and their derivatives with hydroxy, amino, imino, carboxy, mercapto, nitro and alkyl substituted groups as well as urea and thiourea, salicylaldoxime, cupferron, ethylenediamine, amino acids containing sulfur, p-aminobenzaldehyde, halo acetic acids, thiols such as phosphonic acids (e.g., dodecylmercaptan and octanephosphonic acid), monosaccharides and N-benzoyl-N-phenylhydroxyamine.

According to a feature of the present invention, a composition of the present invention is substantially devoid of copper complexing agents such as ammonium cations so as to avoid dissolution of copper metal by the composition.

According to a feature of the present invention, a composition of the present invention includes abrasive particles, such as metal oxides. Suitable metal oxides include but are no limited to oxides of aluminum, cerium, germanium, silicon, titanium, zirconium and mixtures thereof. Specific examples of suitable abrasives include $SiO_2$, $CeO_2$, $Al_2O_3$, $SiC$, $Si_3N_4$ and $Fe_2O_3$. In one embodiment of the present invention the abrasive particles make up between about 1% and 30% by weight of the composition.

According to the teachings of the present invention there is also provided a method for preparation of a composition of the present invention by preparing a solution having a pH equal to or greater than about 9 and having an oxidation potential sufficient to oxidize the surface to form copper oxides, wherein neither copper nor the formed copper oxides are substantially soluble in the composition.

According to a feature of the method of the present invention, a composition is prepared by providing a solution including water and adding to the solution a cation selected from the group consisting of alkaline metal cations and alkaline earth metal cations and an anion of a weak acid in an amount so that the pH of the solution is equal to or greater than about 9 and also adding to the solution an oxidizing agent so that the oxidation potential of the solution is more positive than about $P_{pH}$ volt relative to a saturated calomel reference electrode, where:

$$P_{pH} = -0.05 \times pH + 0.425$$

and where pH is the pH of the solution.

Suitable oxidizing agents added include but are not limited to phenols, peroxides, permanganates, chromates, iodates, iron salts, aluminum salts, sodium salts, potassium salts, phosphonium salts, chlorates, perchlorates, persulfates and mixtures thereof, examples including phenol, $KIO_3$, $KBrO_3$, $K_3Fe(CN)_6$, $K_2Cr_2O_7$, $V_2O_3$, $H_2O_2$, HOCl, KOCl and $KMgO_4$ and in particular $KMnO_4$.

According to a feature of the method of the present invention, a composition of the present invention is prepared by adding abrasive particles, such as metal oxides, to the solution. Suitable metal oxides include but are not limited to oxides of aluminum, cerium, germanium, silicon, titanium, zirconium and mixtures thereof. Specific examples of suitable abrasives include $SiO_2$, $CeO_2$, $Al_2O_3$, SiC, $Si_3N_4$ and $Fe_2O_3$. In one embodiment of the present invention the abrasive particles are added so as to make up between about 1% and 30% by weight of the composition.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings:

FIGS. 4A-4C depict anodic polarization curves of copper measured at various scan rates subsequent to cathodic pre-treatment at −1.5V for 5 minutes in 0.3 g/l (FIG. 4A), 3 g/l (FIG. 4B) and 30 g/l (FIG. 4C) sodium hydroxide solutions;

DESCRIPTION OF THE PREFERRED EMBODIMENTS

Figure 1:
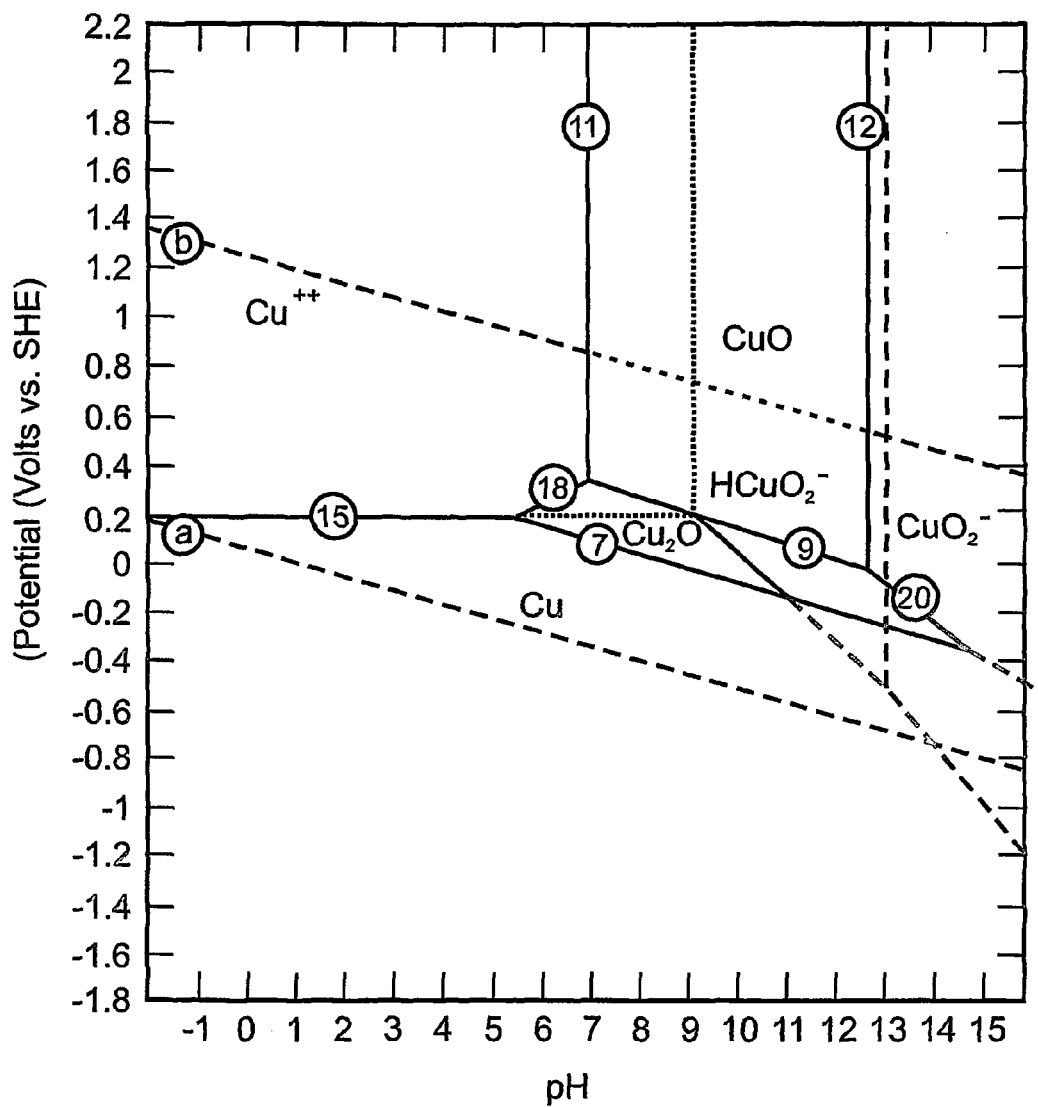
FIG. 1 is the Pourbaix diagram of copper (Potential-pH equilibrium diagram of copper-water system at 25° C. considering the solid substances Cu, $Cu_2O$, and CuO) $[Cu^{2+}]=10^{-6}$ M) from "Atlas of Equilibrium in Aqueous Solutions", M. Pourbaix, NACE, Houston Tex., USA (1975)

The present invention is of a composition, a process for making the composition and uses for the composition. A composition of the present invention is useful for the formation of a passivating layer on a copper-containing surface. By passivating layer is meant a layer of copper oxides that is substantially insoluble in the composition itself. As is clear to one skilled in the art, a composition such as a composition of the present invention that forms a passivating oxide layer is useful, for example, as a slurry in the CMP of a copper-containing surface.

The present invention also provide for the use of a composition of the present invention for forming a passivating layer on a copper-containing surface.

The present invention also provides a method of forming a passivating layer on a copper-containing surface, by contacting the surface with a composition of the present invention.

The present invention also provides a method for planarizing a copper-containing surface, by abrading the surface in the presence of a composition of the present invention.

As used herein, the term "process" and the term "method" refers to manners, means, techniques and procedures for accomplishing a given task including, but not limited to, those manners, means, techniques and procedures either known to, or readily developed from known manners, means, techniques and procedures by practitioners of the chemical, pharmacological, biological, biochemical and medical arts.

The principles and uses of the processes, compositions and methods of the present invention may be better understood with reference to the description and examples hereinbelow.

Before explaining at least one embodiment of the invention in detail, it is to be understood that the invention is not limited in its application to the details set forth in the following description or exemplified by the Examples. The invention is capable of other embodiments or of being practiced or carried out in various ways. Also, it is to be understood that the phraseology and terminology employed herein is for the purpose of description and should not be regarded as limiting.

The present invention is based on using a basic solution having a pH equal to or greater than about 9 that passivates a copper-containing surface, that is the surface is rapidly oxidized to yield a uniform layer of substantially insoluble copper oxides, apparently CuO or $Cu_2O$. It has been unexpectedly found that a solution having a pH of equal to or greater than about 9 and wherein copper is substantially insoluble can passivate a copper-containing surface by forming a layer of copper oxides that are substantially insoluble in the composition, if the oxidation potential of the solution is sufficient.

The teachings of the present invention define the parameters of a composition that is fast-acting, quickly oxidizing bare copper to form an oxide layer. At the same time, the composition is formulated so that neither copper metal nor oxides formed are significantly soluble in the slurry. Certain compositions of the present invention form thin oxide layers composed of homogenously sized oxide particles, oxide layers that are known in the art as being useful for CMP.

While not wishing to be held to any one theory, it is believed that the unexpected efficacy of an oxidizing solution having a pH of greater than about 9 as a copper passivating solution can be explained by understanding the chemistry of copper oxidation with the help of the Pourbaix diagram (FIG. 1) describing the electrochemical properties of copper.

From the Pourbaix diagram it is seen, from the line labeled 7, that copper can be passivated in slurries having a pH between about 7 and about 13. From the Pourbaix diagram it is also seen that at pHs above 13 copper is dissolved by the formation of soluble cuprite ions ($CuO_2^-$). From the Pourbaix diagram it is seen that depending on the pH of a composition, a sufficient oxidation potential for passivation is more positive than −0.2V, −0.15, −0.10, −0.05, 0.0, 0.05, 0.1, 0.15, 0.20, 0.25, 0.3, 0.35, 0.40, 0.45, 0.50, 0.55, 0.60, 0.65 and up to about 0.7V.

The minimal value of a "sufficient oxidation potential" for a given solution depends on the pH of the solution. From the Pourbaix diagram it is seen that for a solution with a pH of between about 9 and about 10, a sufficient oxidation potential is more positive than about −0.05 volt relative to a saturated calomel reference electrode, for a solution with a pH of between about 10 and about 11, a sufficient oxidation potential is more positive than about −0.1 volt relative to a saturated calomel reference electrode, for a solution with a pH of between about 11 and about 12, a sufficient oxidation potential is more positive than about −0.15 volt relative to a saturated calomel reference electrode and that for a solution with a pH of between about 12 and about 13, a sufficient oxidation potential is more positive than about −0.2 volt relative to a saturated calomel reference electrode.

From FIG. 1 it is seen that the equation of the line labeled 7 is roughly $$P_{pH} = -0.05 \times pH + 0.425$$

where pH is the pH of a solution and $P_{pH}$ is the potential, in units of volts relative to a saturated calomel reference electrode, above which the oxidation potential of a solution must be to be sufficient for passivation of a copper-containing surface as defined herein.

It is important to remember that the Pourbaix diagram takes into account only the thermodynamics of oxidation (relative to a standard hydrogen electrode) and does not account for kinetic effects. The Pourbaix diagram can therefore be considered as doing no more than assisting one skilled in the art to understand the theoretical underpinnings of the present invention. The experimental results presented hereinbelow are necessary to reduce the invention to practice.

A preferred composition of the present invention is a solution including a) a cation selected from the group of alkaline metal cations and alkaline earth metal cations; and b) an anion of a weak acid, and having a pH of greater than about 9. In such a solution, the basic environment necessary for effective copper passivation according to the teachings of the present invention is achieved.

Cations suitable for formulating a composition of the present invention include $Li^+$, $Na^+$, $K^+$, $Rb^+$, $Cs^+$, $Be^{2+}$, $Mg^{2+}$, $Ca^{2+}$, $Sr^{2+}$ and $Ba^{2+}$.

Anions suitable anions for formulating a composition of the present invention include anions of weak acids, such as acids having a $pK_a$ of greater than about 0. Suitable anions include, but are not limited to anions chosen from the amongst acetate, adipate, bicarbonate, bisulfate, carbonate, chloroacetate, citrate, crotonoate, cyanate, glutarate, dihydrogen phosphate, hydrogen phosphate, hydrogen sulfate, hydroxide, d-lactate, l-lactate, d-malate, l-malate, maleate, d-mandelate, l-mandelate, malonate, oxalate, permanganate, phosphate, hydrogen phthalate, phthalate, propanoate, succinate, sulfanilate, sulfate, d-tartarate and l-tartarate.

In a preferred embodiment of the present invention, the cation is $K^+$ and the anion is carbonate. In another preferred embodiment of the present invention, the cation is $Cs^+$ and the anion is carbonate.

In some cases, a composition of the present invention includes an oxidizing agent. Such cases include when a "sufficient oxidation potential" is not achieved only by the combination of the cation and anion described hereinabove or there is some other reason such as a desire to change the kinetics of oxide formation, or a desire to change the exact nature of the oxide layer formed.

Suitable oxidizing agents added include both organic compounds (such as phenols) and inorganic compounds (such as peroxides, permanganates, chromates, iodates, iron salts, aluminum salts, sodium salts, potassium salts, phosphonium salts, chlorates, perchlorates, persulfates and mixtures thereof). Examples of suitable oxidizing agents include phenol, $KIO_3$, $KBrO_3$, $K_3Fe(CN)_6$, $K_2Cr_2O_7$, $V_2O_3$, $H_2O_2$, HOCl, KOCl and $KMgO_4$ and in particular $KMnO_4$.

One of the primary uses for a composition, such as the composition of the present invention, which is configured to passivate a copper-containing surface, is as a CMP slurry. Therefore, in a preferred embodiment, a composition of the present invention includes abrasive particles, such as a metal oxide powder. Suitable metal oxides include but are no limited to oxides of aluminum, cerium, germanium, silicon, titanium, zirconium and mixtures thereof. Specific examples of suitable abrasives include $SiO_2$, $CeO_2$, $Al_2O_3$, SiC, $Si_3N_4$ and $Fe_2O_3$. In one embodiment of the present invention the abrasive particles make up between about 1% and 30% by weight of the composition.

One of the many advantages of the teachings of the present invention is that a passivating composition can be formulated that is substantially devoid of a film-forming agent as defined in U.S. Pat. Nos. 5,770,095 and 6,569,350. Such film-forming agents are those listed in U.S. Pat. Nos. 5,770,095 and 6,569,350 and include cyclic compounds such as azole, triazole, imidazole, benzotriazole, benzimidazole and benzothiazole and their derivatives with hydroxy, amino, imino, carboxy, mercapto, nitro and alkyl substituted groups as well as urea and thiourea, salicylaldoxime, cupferron, ethylenediamine, amino acids containing sulfur, p-aminobenzaldehyde, halo acetic acids, thiols such as phosphonic acids (e.g., dodecylmercaptan and octanephosphonic acid), monosaccharides and N-benzoyl-N-phenylhydroxyamine.

One of the many advantages of the teachings of the present invention is that a passivating composition can be formulated that is substantially devoid of a copper-complexing agents such as ammonium cations. As is clear one skilled in the art and as mentioned in the introduction hereinabove, copper-complexing agents dissolve copper metal, giving inferior CMP results.

Preparation of a composition of the present invention involves preparing a solution having a pH equal to or greater than about 9 and having an oxidation potential sufficient to oxidize a copper-containing surface to form copper oxides, wherein neither copper nor the formed copper oxides are substantially soluble in the composition.

For example, a composition of the present invention is prepared by providing a solution including water and adding to the solution a cation selected from the group consisting of alkaline metal cations and alkaline earth metal cations and an anion of a weak acid in an aqueous solution in an amount so that the pH of the solution is equal to or greater than about 9 and also adding to the solution an oxidizing agent so that the oxidation potential of the solution is sufficient, as defined hereinabove.

Suitable oxidizing agents to be added include but are not limited to phenols, peroxides, permanganates, chromates, iodates, iron salts, aluminum salts, sodium salts, potassium salts, phosphonium salts, chlorates, perchlorates, persulfates and mixtures thereof, examples including phenol, $KIO_3$, $KBrO_3$, $K_3Fe(CN)_6$, $K_2Cr_2O_7$, $V_2O_3$, $H_2O_2$, HOCl, KOCl and $KMgO_4$ and in particular $KMnO_4$.

As discussed above, when preparing a composition of the present invention, especially a CMP slurry embodiment, abrasive particles, such as metal oxides, are preferably added to the solution, preferably so as to make up between about 1% and 30% by weight of the composition. Suitable metal oxides added include but are not limited to oxides of aluminum, cerium, germanium, silicon, titanium, zirconium and mixtures thereof. Specific examples of suitable abrasives include $SiO_2$, $CeO_2$, $Al_2O_3$, SiC, $Si_3N_4$ and $Fe_2O_3$.

Proof of Concept

To confirm and reduce the innovative hypothesis of the present invention to practice, the oxidation of copper in sodium hydroxide solutions was studied.

First, a 3 g/l sodium hydroxide solution having a pH of 12.5 (NaOH being the sodium salt of the weak acid water) was studied. According to the Pourbaix diagram (FIG. 1), at pH 12.5 copper passivation is expected. The behavior of copper in sodium hydroxide solutions has been extensively investigated by many authors (e.g.: Feng et al. Corrosion 53 (1997) p. 389; Kunze et al. J. Phys. Chem. B 105 (2001) p. 4263; Strehblow et al. Electrochim. Acta 25 (1980) p. 839; Kautek et al. J. Electrochem. Soc. 133 (1986) p. 739; Hamilton et al. J. Electrochem. Soc. 139 (1992) p. 426; Chan et al. J. Phys. Chem B 103(1999) p. 357; Melendres et al. J. Electroanal. Chem. 449 (1998) p. 215; Maurice et al. J. Electrochem. Soc 146(2) (1999) p. 524) using many different analytical techniques, such as Raman spectroscopy, electrochemical measurements, scanning tunneling microscopy and X-rays photoelectron spectroscopy. The formation of different copper oxides including CuOH, $Cu_2O$, CuO has been observed in these investigations. It should be noted that the formation of CuOH was observed at the potential of $-0.675V_{SHE}$ (Maurice et al. J. Electrochem. Soc 146(2) (1999) p. 524). The formation of CuOH was confirmed by scanning tunneling microscopy (Maurice et al. Surface Science 458(2000) p. 185), despite the fact that copper oxides formation at potentials below $-0.2V_{SHE}$ is not in agreement with the Pourbaix diagram (FIG. 1, this potential region is related to copper immunity in basic solutions). Herein were studied the features of copper oxides formation from $-1.5V$ to $1V$ in sodium hydroxide solutions.

Understanding Copper Electrochemistry in Hydroxide Solutions—the Effect of Sodium Hydroxide Concentration In order to understand the effect of pH on copper oxidation in basic solutions, also evaluated were solutions containing 0.3 and 30 g/l NaOH. The pHs of these two solutions were 10.5 and 14.0 respectively. The Pourbaix diagram (FIG. 1) indicates that copper can be dissolved via the formation of soluble cuprite ions ($CuO_2^-$) at a pH above about 13. Thus, in a 30 g/l NaOH solution copper dissolution is expected in addition to oxidation.

Figures 2A, 2B:
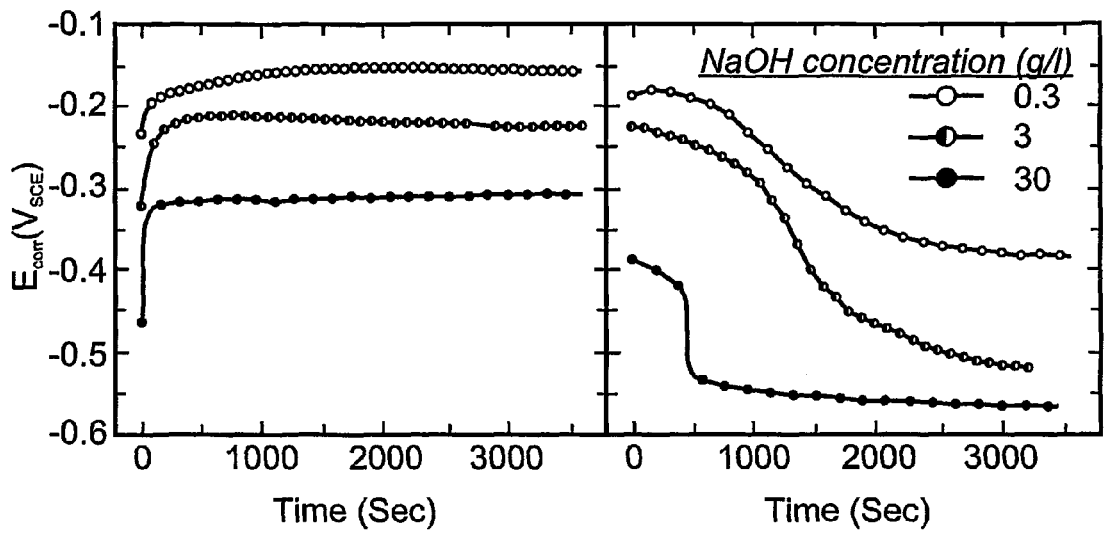
FIG. 2A depicts corrosion potential transients of copper at 25° C. in not deaerated sodium hydroxide solutions.
FIG. 2B depicts corrosion potential transients of copper at 25° C. in deaerated sodium hydroxide solutions.

The corrosion potential transient of copper measured during open-circuit potential (OCP) exposure in sodium hydroxide solutions of 0.3, 3 and 30 g/l NaOH is shown in FIG. 2A for a not-deaerated solution and in FIG. 2B for a deaerated solution. In both the not-deaerated and deaerated solutions the value of the corrosion potential decreased with an increase in the sodium hydroxide concentration. In the not-deaerated cell the corrosion potential sharply increased after immersion up to a certain value and thereafter remained substantially constant. The values of corrosion potentials obtained after one-hour exposure in a not-deaerated and deaerated cell are presented in Table I:

TABLE I

Copper corrosion potential values measured after one hour exposure in a not-deaerated and deaerated sodium hydroxide solutions.

|  | 0.3 g/l | 3 g/l | 30 g/l |
| --- | --- | --- | --- |
| Not-deaerated cell | −0.15 V | −0.21 V | −0.31 V |
| Deaerated cell | −0.375 V | −0.515 V | 0.56 V |

Figures 3A, 3B:
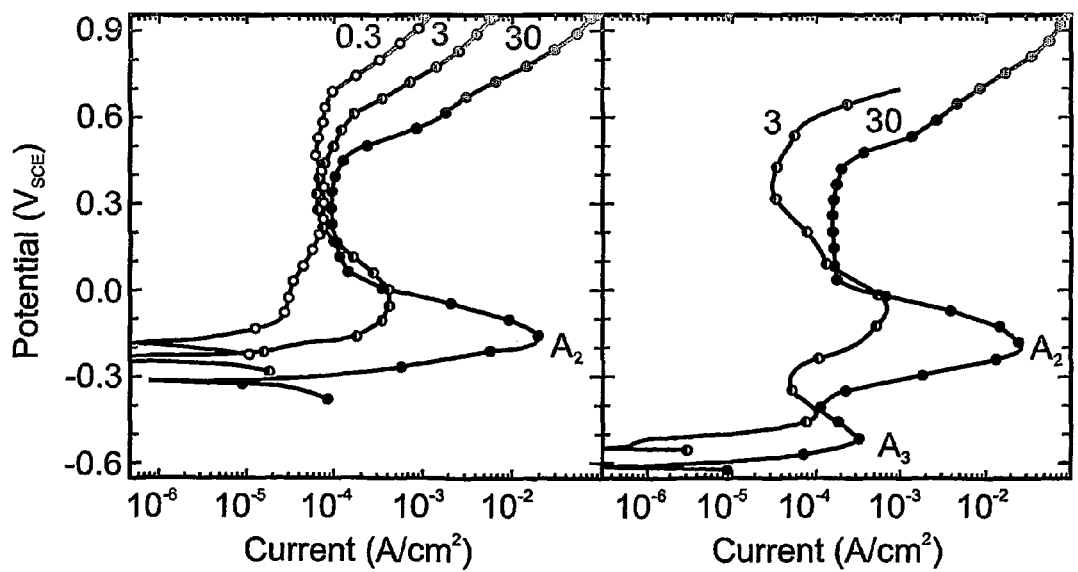
FIG. 3A depicts anodic polarization curves of copper at 25° C. in not deaerated sodium hydroxide solutions at a scan rate of 5 mV/s.
FIG. 3B depicts anodic polarization curves of copper at 25° C. in deaerated sodium hydroxide solutions at a scan rate of 5 mV/s.

The anodic potentiodynamic curves (scan rate of 5 mV/s) for copper after one-hour exposure in the three alkaline solutions are shown in FIG. 3.

In a not deaerated 30 g/l NaOH solution (FIG. 3A) the onset of anodic current was detected at −0.32V and a broad current peak ($A_2$) was observed in the anodic curve. With a decrease in NaOH concentration the onset of the anodic current shifted in the positive direction and the peak $A_2$ markedly decreased. In 0.3 g/l the $A_2$ peak practically disappeared.

In the deaerated solutions (FIG. 3B) the onset of anodic current was observed at potentials below −0.5V and an additional anodic peak, $A_3$, appeared at −0.5V. In the 3 g/l NaOH solution the anodic peak $A_2$ became smaller and shifted to more positive potential compared with 30 g/l NaOH solution.

In FIG. 4 are presented the effects of cathodic pretreatment on the anodic behavior of copper electrodes. These results were obtained at various scan rates (between 5 and 1000 mV/s). Subsequent to the cathodic pretreatment (−1.5V for 5 minutes) the onset of anodic current was observed to be at potentials below −1.0V, in all the examined solutions. Additional anodic peaks ($A_4$ and $A_5$) were detected in the anodic profiles obtained for all the solutions at scan rates above 100 mV/s.

The peaks sequence from $A_1$ to $A_5$ is clearly observed in the 0.3 g/l NaOH solutions (FIG. 4A) but were more pronounced in the 3 g/l NaOH solutions (FIG. 4B) and even more pronounced in the 30 g/l NaOH solutions (FIG. 4C). For example, the anodic peak $A_2$ in the polarization curve obtained at 5 mV/s of the 0.3 g/l NaOH is not well resolved but is well resolved in the polarization curves of the 3 g/l NaOH and 30 g/l NaOH solutions. The anodic currents obtained in all scan rates increased with increase in NaOH concentration.

From these results it is seen that an increase in sodium hydroxide concentration causes a decrease in copper corrosion potential in both not-deaerated and deaerated solutions. In the more concentrated sodium hydroxide solutions the anodic current peak $A_2$ is more pronounced, that is the peak is broader and detected at lower potentials. Similar copper electrochemical behavior was observed in polarization curves obtained subsequent to cathodic pre-treatment at −1.5V for 5 min. with various scan rates, at various sodium hydroxide concentrations.

Characteristics of Copper Oxides at the Potential Region Above −0.25V

From the results above it is clear that copper oxidation in a sodium hydroxide solution strongly depends on the applied potential. For CMP applications, the most important feature is the nature of copper oxidation at $E_{corr}$ and in the potential region above $E_{corr}$. This potential region can be achieved with external polarization or by the addition of an oxidizing agent. The corrosion potential of copper can be shifted from OCP to a positive direction in a wide potential range by varying the nature and concentration of an oxidizing agent added to the solution. Such an addition by itself can enhance passivation characteristics.

Further, the morphology of copper oxides and copper oxide transformation in potential region above −0.4V was studied. Special attention was given to potential region above OCP (−0.25V) in not deaerated solutions. As is clear to one skilled in the art, it is preferable to use not deaerated solutions for CMP as CMP becomes relatively inexpensive once there is no need for deaeration equipment.

The morphology of copper oxides formed at different potentials ($A_1$, $A_2$ and $A_3$ peaks) on rounded copper coupons (0.5 cm radius and 2 mm thick, 99.9995% purity) polished with a 1 μm diamond paste was studied. The oxide growth was conducted using potentiostatic exposure for 30 minute at the examined potentials (−0.4V ($A_3$), −0.15V ($A_2$), and 0.3V ($A_1$)), applied after cathodic pre-treatment for 5 minutes at −1.5V. Subsequent to potentiostatic exposure, the coupons were rinsed with deionized water, dried and examined by high-resolution scanning electron microscopy.

Figure 5:
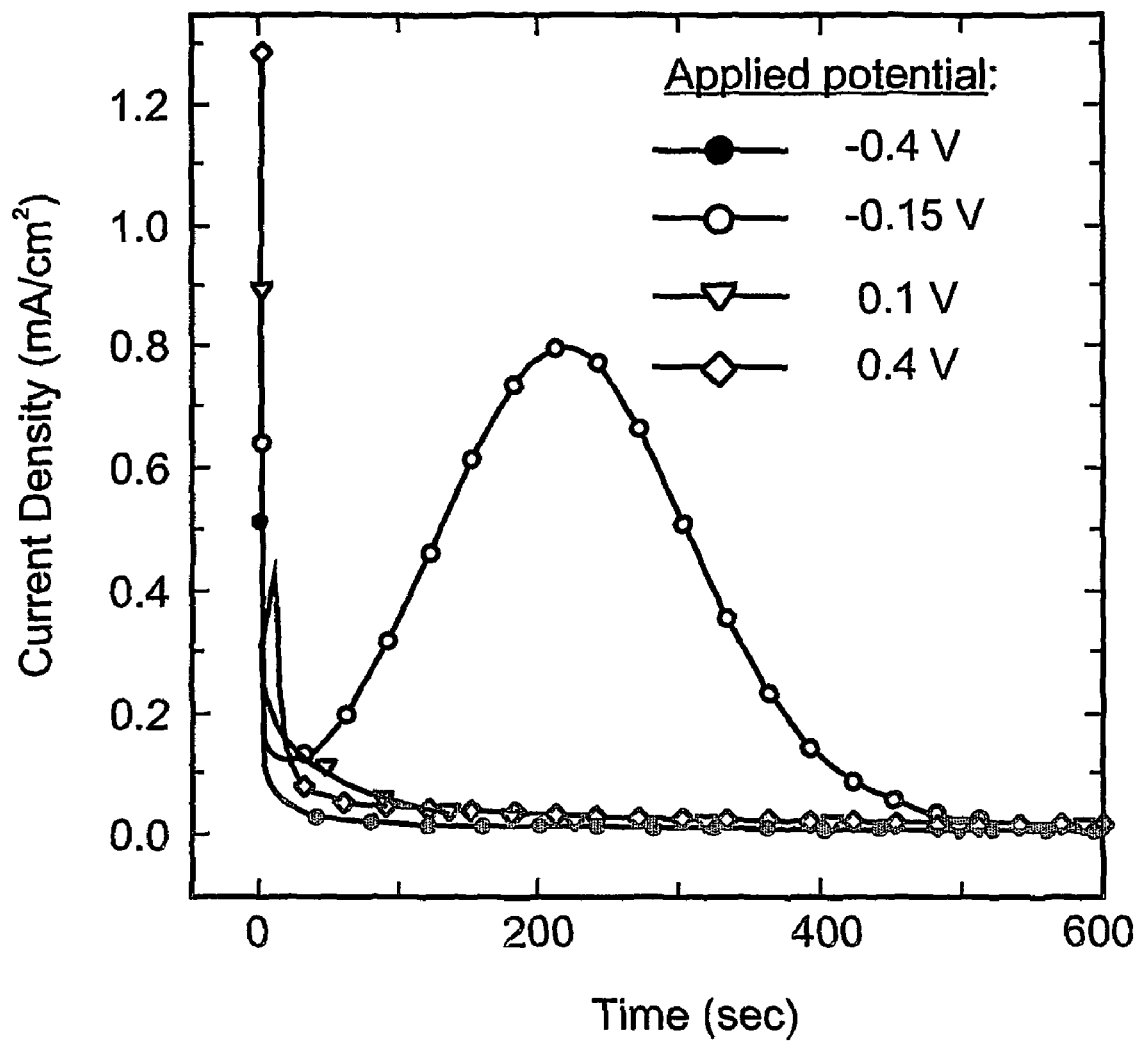
FIG. 5 depicts current transients of copper measured with potentiostatic exposure of copper electrodes at various applied potentials in a 3 g/l sodium hydroxide solution.

The current transients measured during the exposure of the copper coupons at different applied potentials are shown in FIG. 5.

Following the application of −0.4V, the anodic current rapidly decreased down to a value lower than $10 \cdot 10^{-5}$ A/cm$^2$, indicating the formation of a copper oxide layer on the surface of the coupon.

In contrast, the behavior of the anodic current transient following the application of −0.15V was observed to be completely different for the first 20 seconds. When the potential was applied, the anodic current rapidly decreased down to $1 \cdot 10^{-4}$ A/cm$^2$ as was observed for −0.4V. However, during further exposure (200 seconds) a peak in the profile of the anodic current transient with a maximum value of $8 \times 10^{-4}$ A/cm$^2$ was observed. After 600 seconds the anodic current decreased down to $1 \times 10^{-5}$ A/cm$^2$. The anodic current peak observed during copper exposure at −0.15V is attributed to alteration in the nature of the copper oxide layer.

Following the application of 0.1V, the anodic current gradually decreased during exposure as was observed at −0.4V. However, unlike the situation observed at −0.4V, the decrease in the anodic current at 0.1V was much slower, especially during the first 200 seconds. No peak of anodic current was detected during exposure at 0.1V. The detected peak was very small and observed after 10 seconds exposure. During further exposure the anodic current decreased to very low values (ca. $1 \times 10^{-5}$ A/cm$^2$ after 200 seconds exposure).

The different anodic current transient profiles measured at different applied potentials are associated with variations in the nature of the produced oxide films.

The variations in the nature of the produced oxide films were examined using high-resolution scanning electron microscopy. FIG. 6 show the surface morphology of a polished copper surface (FIG. 6A) and copper surfaces exposed to different applied potentials corresponding to the anodic peaks $A_1$, $A_2$ and $A_3$ in 3 g/l sodium hydroxide solution.

Figure 6A:
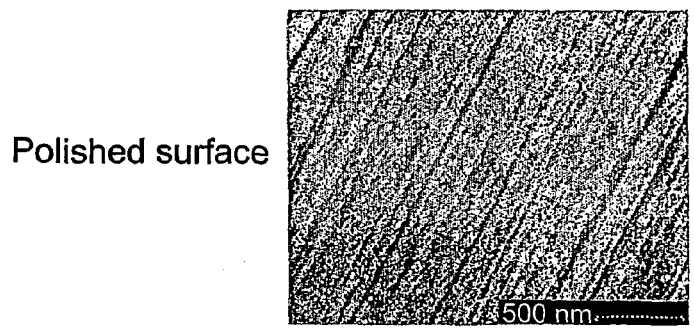
FIGS. 6A-6G are high-resolution scanning electron microscope images of various copper surfaces after 30 minutes exposure at different applied potentials in 3 g/l sodium hydroxides including a polished copper surface (FIG. 6A), −0.4V (FIGS. 6B and 6C), −0.15V (FIGS. 6D and 6E) and 0.3V (FIGS. 6F and 6G)
Figure 6B:
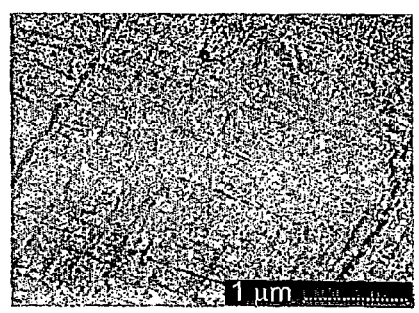
Figure 6C:

FIGS. 6B and 6C show the oxides developed on copper after 30 minutes exposure at −0.4V. The copper oxide (apparently $Cu_2O$) covering the electrode surface after exposure at −0.4V is characterized as a dense layer with a deposition of small globular crystal having average dimensions of between 50 and 100 nanometer.

Figure 6D:
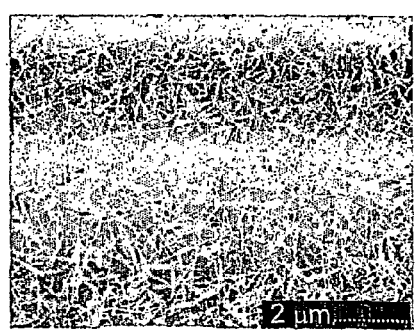
Figure 6E:
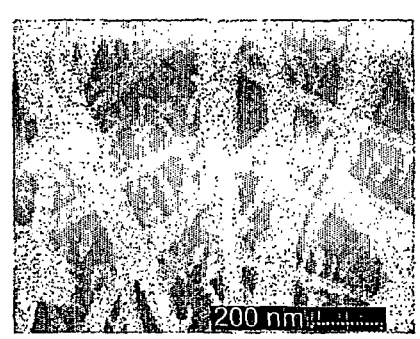

The morphology of the copper surface after exposure at −0.15V was completely different, FIGS. 6D and 6E. The whole surface was covered with a thick crystalline layer (probably CuO). This deposit had a two-layer structure: the lower layer consisting of small-elongated crystals (significantly lower than 1 micron) while the upper layer consisted of large needle-like crystals.

Figure 6F:
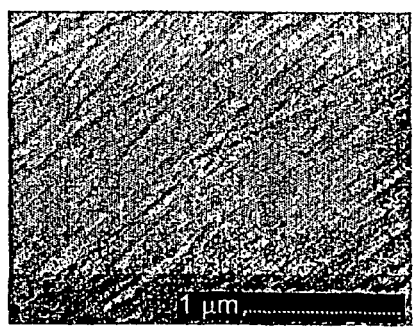
Figure 6G:
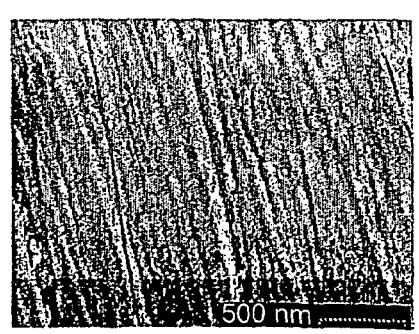

No deposits were observed after exposure to 0.3V (even at a ×200000 magnification), FIGS. 6F and 6G. The appearance of the copper surface after exposure to 0.3V did not change and was similar to a freshly polished surface. Apparently, the copper oxide that formed at 0.3V was very thin and dense.

In order to determine the variations in copper oxides coating formed during copper exposure at OCP, the morphology of copper surfaces developed at different stages of OCP exposure was compared to the morphology obtained at different applied potentials. The results are shown in FIG. 7.

Figure 7A:
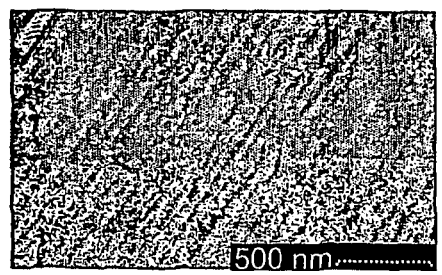
FIGS. 7A-7G are high-resolution scanning electron microscope images of various copper surfaces after various exposure times to OCP in 3 g/l sodium hydroxides 30 minutes (FIG. 7A), 60 minutes (FIGS. 7B and 7C), 160 minutes (FIGS. 7D and 7E) and 300 minutes (FIGS. 7F and 7G)

FIG. 7A was obtained after 30 minutes exposure at OCP in a 3 g/l NaOH solution. Only traces of copper oxide were detected on the copper surface.

Figure 7B:
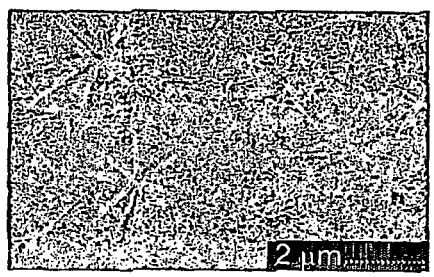

The surface morphology obtained after 30 min exposure at OCP was very similar to the one detected at −0.4V, FIG. 7B.

Figure 7C:

After a one-hour exposure, the copper surface was covered with deposits of both short (ca. 100 nm) and long (ca. 2 μm) needle-like crystals (FIG. 7C).

Changes observed upon further exposure were related only to crystal size.

Figure 7D:
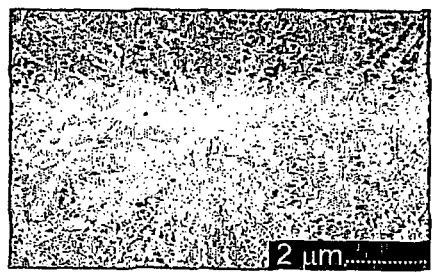
Figure 7E:

After 2.5 hours the size of both short and long crystals increased up to 250 nm and ca. 6 microns respectively (FIGS. 7D and 7E).

Figure 7F:
Figure 7G:
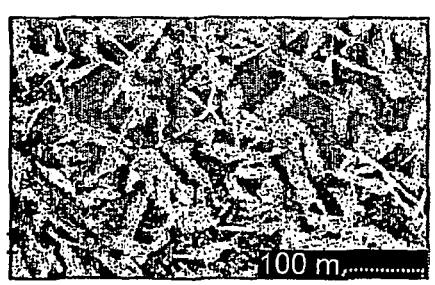

After 5 hours exposure the short crystals reached ca. 500 nm length (FIGS. 7F and 7G). It is seen that the long crystals became distorted. It should be noted that the morphology of copper oxide crystals observed during OCP exposure differed from the morphology observed at −0.15V, compare to FIGS. 6D and 6E.

Based on these results it can be concluded that a copper surface exposed at potentials below 0.0V is covered with flaky deposits of oxides. At potentials above 0.0V, a copper surface becomes covered with very thin, dense film of oxides.

Determination of Copper Passivation Potential Range Needed For CMP

The transformation of copper oxides from one form to another was studied using the corrosion potential decay method. A copper electrode was first exposed to −0.15V for 10 minutes and thereafter to a more positive potential. In some cases the copper electrode was immediately exposed to potential above 0.0V. After interruption of potentiostatic exposure, the corrosion potential decay was measured. The results are shown in FIG. 8 and FIG. 9.

Figure 8:
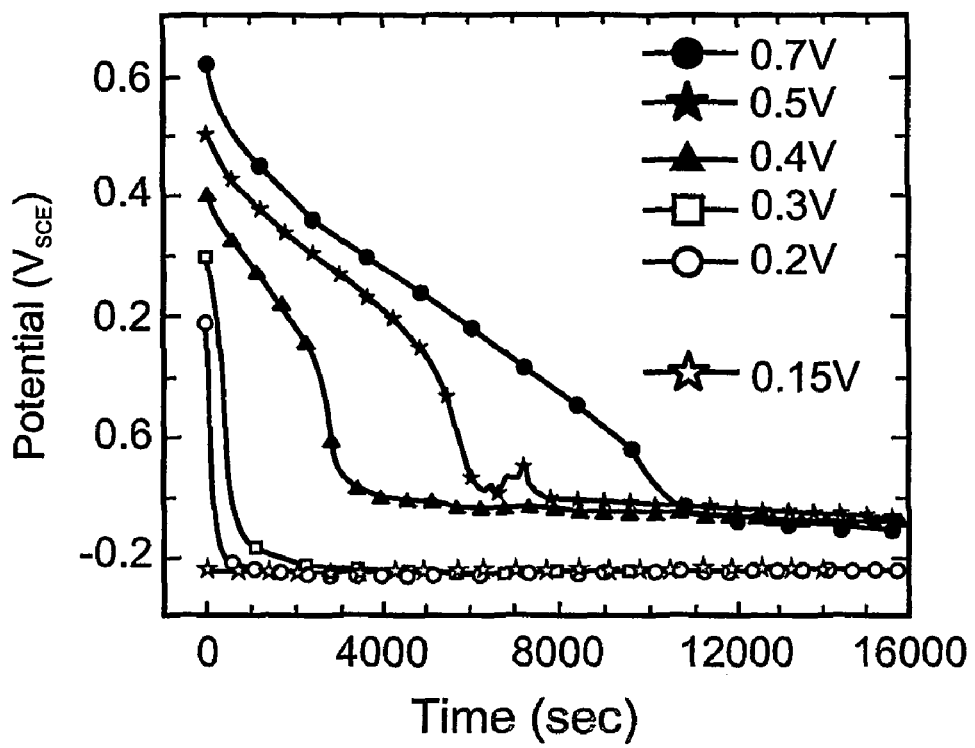
FIG. 8 depicts the corrosion potential transients of copper in a 3 g/l sodium hydroxide solution subsequent to 10 minute exposure to 0.15V followed by 30 minutes exposure to more positive potentials.
Figure 9:
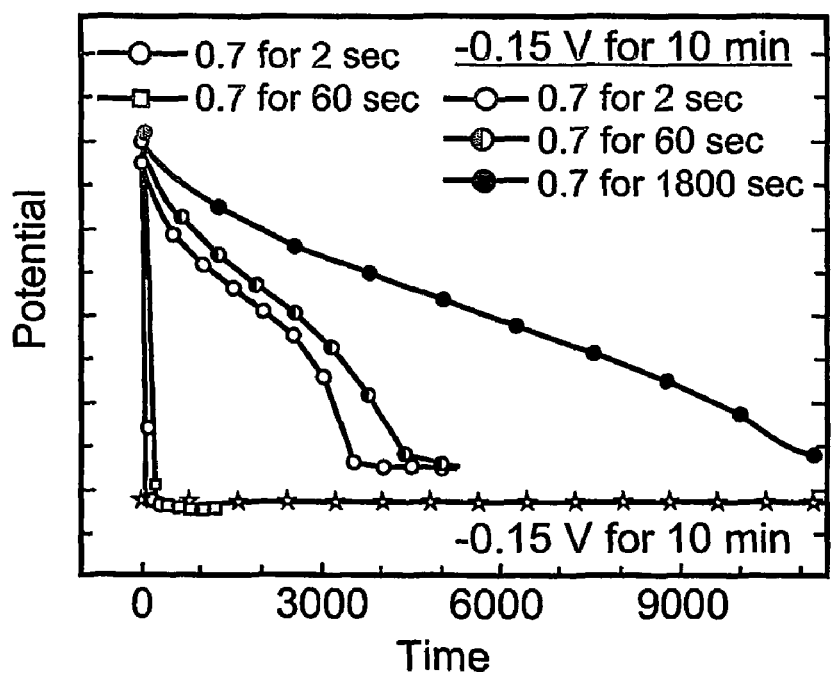
FIG. 9 depicts the corrosion potential transient of copper in a 3 g/l sodium hydroxide after different potentiostatic pre-treatments.

FIG. 8 presents results of corrosion potential decay obtained after 10 minutes exposure to −0.15V followed with a shift in the applied potential to more positive values and further exposure for 30 min at the new applied potential. In FIG. 8 it is seen that interruption of electrode exposure at −0.15V is accompanied by a rapid decrease in the corrosion potential down to values slightly below −0.2V. Similar results were also obtained when exposure to −0.15V was followed by exposure to 0.2 and 0.3V. As is seen in FIG. 8, a rapid drop to values below −0.2V accompanies interruption of polarization at 0.2 and 0.3V. The situation changes if pre-exposure at —0.15V is followed by the potentiostatic exposure at 0.4V and higher potentials. As is seen in FIG. 8, a marked potential delay occurred in the decay curves obtained after exposure to potentials higher than 0.3V. The higher the potential applied after exposure to −0.15V, the longer the potential delay in the decay curves. It is reasonable to assume that exposure at potentials 0.2 and 0.3V after pre-treatment at −0.15V is accompanied by the formation of very thin oxides on the electrode surface. At potentials above 0.3V either the thickness (or amount) of the new oxides increases or the transformation of oxides formed at −0.15V into different oxides occurs.

In order to determine the role of copper oxides covering electrode surface after exposure to −0.15V and the nature of copper oxides formed at potentials above 0.0V the potential decay after exposure at 0.7V with and without pretreatment at −0.15V was examined. The obtained results are shown in FIG. 9. As is seen in FIG. 9, once the potential of 0.7V is applied without pre-treatment at −0.15V the corrosion potential rapidly decreases without an intermediate delay. In contrast, exposure at 0.7V after pre-exposure at −0.15V results in a significant potential delay. The longer the exposure of the pre-treated electrodes at 0.7V, the wider the potential delay. It should be also noted that in all the cases when the delay occurred, the corrosion potential during long term exposure reached the potential values of approximately −0.15V.

These results provide evidence that the nature of copper oxides formed at potentials above 0.0V depends in a large part on the initial surface state of copper. It can be suggested that two different copper oxides are formed on the copper surface at potentials above 0.0V. In the case of bare copper, a thin oxide film is formed. If a copper oxide layer is formed on electrode surface during exposure at potentials below 0.0V, the transformation of the original copper oxide layer to a new type takes place when a potential of 0.7V is applied.

It is therefore seen that the potential region between 0.0V and 0.7V is characterized by the formation of two different copper oxides. The electrochemical measurements described hereinabove indicate that these oxides are different from the oxides formed at potentials below 0.0V. The copper oxides formed at potentials below 0.0V undergo transformation during increase of applied potentials above 0.0V.

Figure 10A:
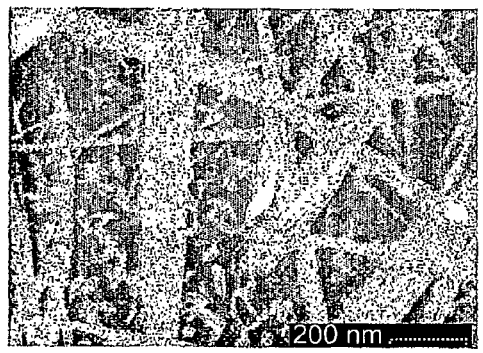
FIGS. 10A-10C are high-resolution scanning electron microscope images of various copper surfaces developed in 3 g/l sodium hydroxide solutions at −0.15V for 10 minutes (FIG. 10A), 0.7V for 15 minutes (FIG. 10B) and initially pre-treated at −0.15V for 10 minutes followed by 0.7V potential for 60 seconds (FIG. 10C)
Figure 10B:
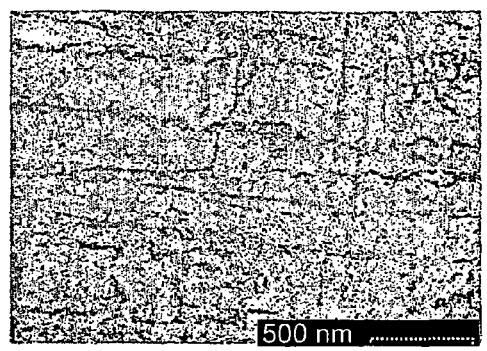
Figure 10C:
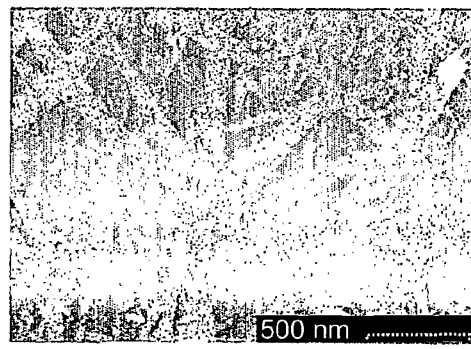

The difference between copper oxide morphologies developed during potentiostatic exposure at −0.15V and 0.7V is clearly seen in FIGS. 10A and 10B. In FIG. 10C, the transformation of copper oxide formed at −0.15V after an increase in the applied potential to 0.7V and further exposure for 30 minute is seen. As can be seen, copper oxide formed on the untreated copper surface at 0.7V (FIG. 10B) is dramatically different from the morphology observed at −0.15V (FIG. 10A). FIG. 10C presents the morphology developed at the copper surface exposed at 0.7V for 30 minutes after a pre-treatment process at −0.15V for 10 minutes. At −0.15V, the oxide has a two-layer structure: small crystals in a first layer and large crystals in an upper layer. Comparing FIGS. 10A and 10C indicates that by applying a potential of 0.7V the first layer disappeared or changed to another form.

CONCLUSION

It can be concluded that copper oxides formed in solutions including an alkaline metal cations or an alkaline earth metal cation and an anion of a weak acid, such as sodium hydroxide at potentials above 0.0V and in the pH range of between 7 and 12 are the most applicable for copper CMP application. These oxides are highly dense, thin and behave as a passive film. The combination of an aqueous solution with a pH of between 7 and 12, together with an oxidizing agent (instead of the external power supply used herein) provide a passivation potential of up to 0.7V, although potentials of between 0.3V and 0.4V are sufficient.

These hypotheses were confirmed by the following examples.

EXAMPLES

Reference is now made to the following examples that, together with the above description, illustrate the invention in a non-limiting fashion.

Example 1

Passivation of a Copper Surface Using $KMNO_4/K_2CO_3$ Solutions

Three aqueous potassium carbonate solutions were prepared:
Solution I: 4 g/liter $K_2CO_3$;
Solution II: 4 g/liter $K_2CO_3$ with 0.01 g/liter $KMnO_4$; and
Solution III: 4 g/liter $K_2CO_3$ with 1 g/liter $KMnO_4$.

Figure 11:
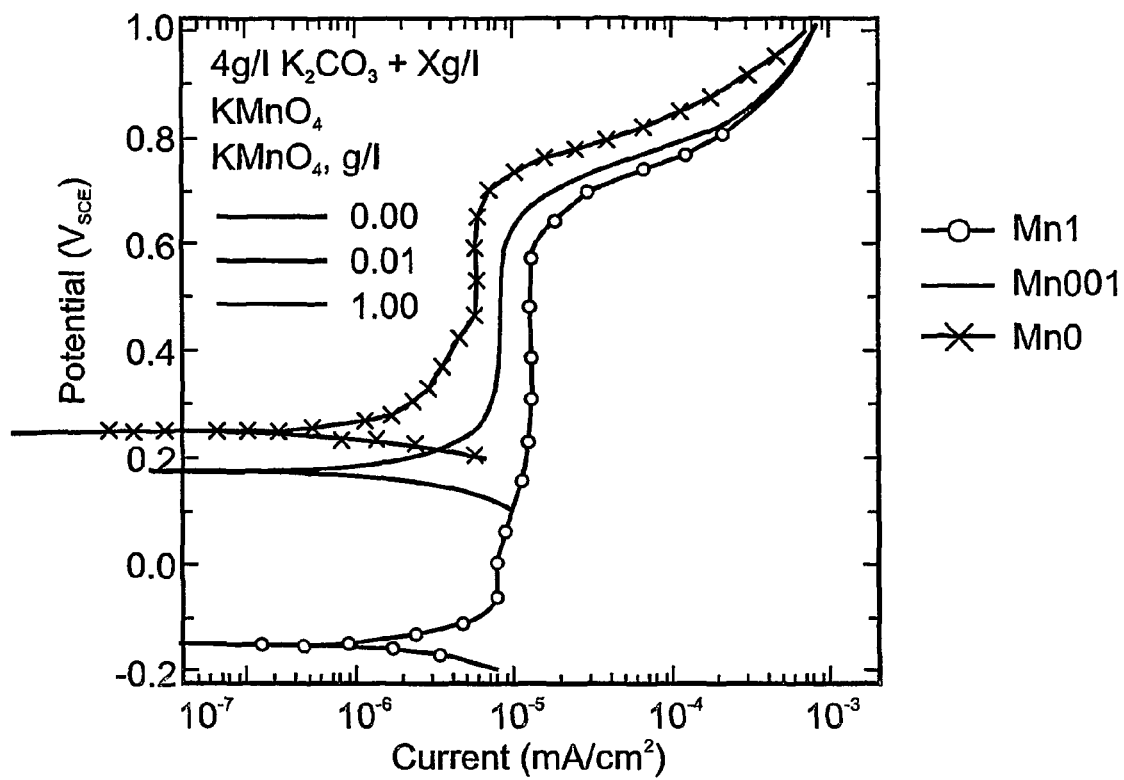
FIG. 11 is a potentiodynamic profile of copper in a $K_2CO_3$ solution with and without the addition of $KMnO_4$ as an oxidizing agent.

The pH of the three solutions was determined to be 12. The potentiodynamic profile of a copper plate was measured in solutions I, II and III. The results are depicted in FIG. 11. From FIG. 11 it is seen that copper is passivated in solution I only in the range of potentials between 0.0 and 550 mV. The addition of $KMnO_4$ in solutions II and III increases the passivation potential to 180 mV and 220 mV respectively.

Passivation of a Copper Surface Using $KMNO_4/K_2CO_3$ Solutions

An aqueous potassium carbonate/potassium permanganate solution was prepared:
Solution IV: 4 g/liter $K_2CO_3$ with 0.05 g/liter $KMnO_4$.

Figure 12:
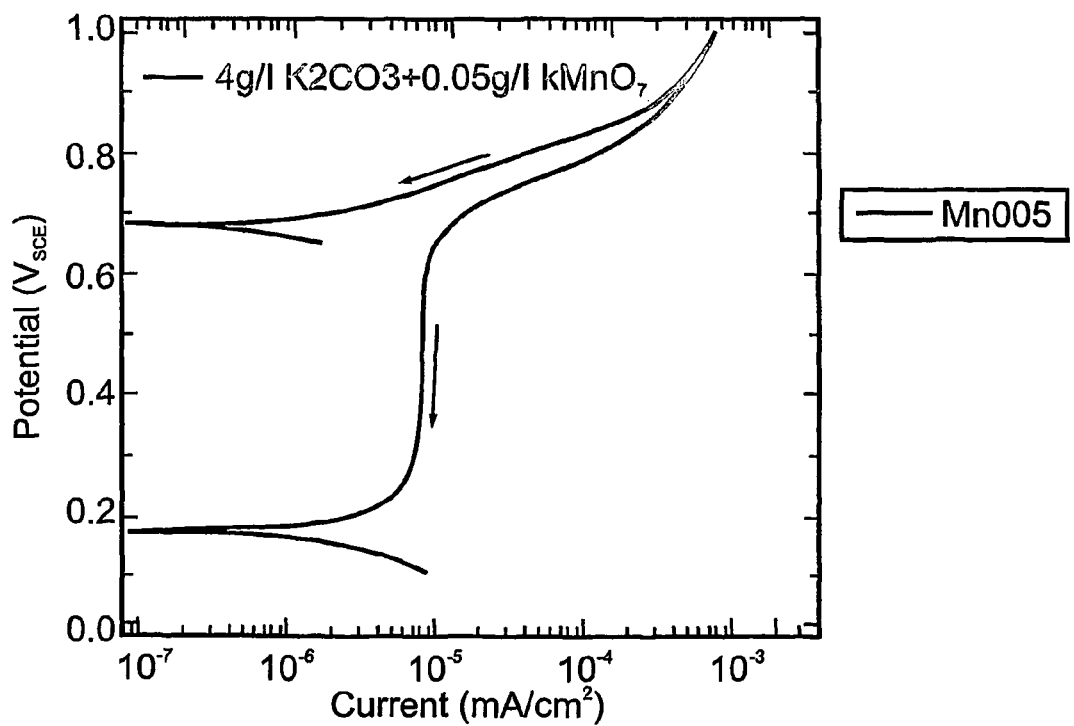
FIG. 12 is a graph of the cyclic polarization of copper in a $K_2CO_3$ solution containing $KMnO_4$ as an oxidizing agent.

The pH of the solution IV was determined to be 12. The potentiodynamic profile of a copper plate was measured in solutions IV. The results are depicted in FIG. 12. From FIG. 12 it is seen that the passivation potential of copper is 180 mV. It is seen that no pitting occurs during polarization.

Materials, Instruments and Experimental Methods
Materials:
All chemicals were obtained from Sigma-Aldrich Ltd. (St. Louis, Mo., USA).

3.5 mm diameter copper metal rods (99.9995 wt. %) were mounted in an epoxy resin to produce pencil-type copper electrodes. The electrodes were freshly wet-abraded to a 1200 grit finish prior to each experiment.

The morphology of etched copper surfaces was performed with rounded copper coupons (2 mm thick, 0.5 cm radius, 99.9995 wt. %) polished with 1 micron diamond paste.

Instruments:

Electrochemical measurements were performed in a three-electrode electrochemical cell with using a 273A EG&G Potentiostat. Working electrode potentials were referenced to a saturated calomel electrode (SCE) connected through a Luggin-Habber capillary tip assembly. The counter electrode was a Pt-wire.

The morphology of the corroded copper surfaces was studied by scanning electron microscopy (SEM L30 Carl Zeiss Inc., Germany). Prior to observation, specimens were washed in deionized water and air-dried.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A composition comprising a solution which has a pH that ranges from 9 to 13 and is being devoid of a film-forming agent, a copper complexing agent and ammonium cations, the composition is being such that when it is applied to a surface which includes more than 5% copper by weight, it oxidizes copper to form copper oxides wherein neither said copper nor said copper oxides are soluble in the composition, the composition being useful for the formation of a passivating layer on said surface.

2. The composition of claim 1, wherein the surface includes more than 10% copper by weight.

3. The composition of claim 1, wherein the surface includes more than 20% copper by weight.

4. The composition of claim 1, wherein the surface includes more than 40% copper by weight.

5. The composition of claim 1, wherein the surface includes more than 50% copper by weight.

6. The composition of claim 1, wherein the surface includes more than 80% copper by weight.

7. The composition of claim 1, wherein said oxidation potential is lower than $P_{pH}$ volt relative to a saturated calomel reference electrode, where $$P_{pH} = -0.05 \times pH + 0.425$$

pH being said pH of the composition.

8. The composition of claim 1, wherein said pH is between 9 and 10 and said oxidation potential is lower than −0.05 volt relative to a saturated calomel reference electrode.

9. The composition of claim 1, wherein said pH is between 10 and 11 and said oxidation potential is lower than −0.1 volt relative to a saturated calomel reference electrode.

10. The composition of claim 1, wherein said pH is between 11 and 12 and said oxidation potential is lower than −0.15 volt relative to a saturated calomel reference electrode.

11. The composition of claim 1, wherein said pH is between 12 and 13 and said oxidation potential is lower than −0.2 volt relative to a saturated calomel reference electrode.

12. The composition of claim 1, wherein said oxidation potential is lower than a saturated calomel reference electrode by an oxidation potential selected from the group consisting of −0.2 volt, −0.15 volt, −0.10 volt, −0.05 volt, 0.0 volt, 0.05 volt, 0.10 volt, 0.15 volt, 0.20 volt, 0.25 volt, 0.3 volt, 0.35 volt, 0.40 volt, 0.45 volt, 0.50 volt, 0.55 volt, 0.60 volt, 0.65 volt and 0.7 volt.

13. The composition of claim 12, wherein said oxidation potential is lower than a saturated calomel reference electrode by an oxidation potential of at least 0.0 volt.

14. The composition of claim 1, comprising
a) a cation selected from the group of alkaline metal cations and alkaline earth metal cations; and
b) an anion of a weak acid.

15. The composition of claim 14, wherein said cation is selected from the group consisting of $Li^+$, $Na^+$, $K^+$, $Rb^+$, $Cs^+$, $Be^{2+}$, $Mg^{2+}$, $Ca^{2+}$, $Sr^{2+}$ and $Ba^{2+}$.

16. The composition of claim 14, wherein said weak acid has a pKa greater than 0.

17. The composition of claim 14, wherein said anion is selected from the group consisting of acetate, adipate, bicarbonate, bisulfate, carbonate, chloroacetate, citrate, crotonoate, cyanate, glutarate, dihydrogen phosphate, hydrogen phosphate, hydrogen sulfate, hydroxide, d-lactate, l-lactate, d-malate, l-malate, maleate, d-mandelate, l-mandelate, malonate, oxalate, permanganate, phosphate, hydrogen phthalate, phthalate, propanoate, succinate, sulfanilate, sulfate, d-tartarate and l-tartarate.

18. The composition of claim 14, wherein said cation is $K^+$ and said anion is carbonate.

19. The composition of claim 14, wherein said cation is $Cs^+$ and said anion is carbonate.

20. The composition of claim 14, further comprising an oxidizing agent.

21. The composition of claim 20, wherein said oxidizing agent is selected from the group consisting of phenols, peroxides, permanganates, chromates, iodates, iron salts, aluminum salts, sodium salts, potassium salts, phosphonium salts, chlorates, perchlorates, persulfates and mixtures thereof.

22. The composition of claim 20, wherein said oxidizing agent is selected from the group consisting of phenol, $KMnO_4$, $KIO_3$, $KBrO_3$, $K_3Fe(CN)_6$, $K_2Cr_2O_7$, $V_2O_3$, $H_2O_2$, HOCl, KOCl and $KMgO_4$.

23. The composition of claim 20, wherein said oxidizing agent is $KMnO_4$.

24. The composition of claim 1, comprising abrasive particles.

25. The composition of claim 24, wherein said abrasive particles are metal oxides.

26. The composition of claim 25, wherein said metal oxide is selected from the group consisting of oxides of aluminum, cerium, germanium, silicon, titanium, zirconium and mixtures thereof.

27. The composition of claim 24, wherein said abrasive particles are chosen from the group comprising $SiO_2$, $CeO_2$, $Al_2O_3$, SiC, $Si_3N_4$ and $Fe_2O_3$.

28. The composition of claim 24, wherein said abrasive particles comprise between 1% and 30% by weight of the composition.

29. The composition of claim 1, consisting of:
a) a cation selected from the group of alkaline metal cations and alkaline earth metal cations;
b) an anion of a weak acid;
c) abrasive particles; and
d) an oxidizing agent.

30. The composition of claim 29, wherein said cation is selected from the group consisting of $Li^+$, $Na^+$, $K^+$, $Rb^+$, $Cs^+$, $Be^{2+}$, $Mg^{2+}$, $Ca^{2+}$, $Sr^{2+}$ and $Ba^{2+}$.

31. The composition of claim 29, wherein said weak acid has a pKa greater than 0.

32. The composition of claim 29, wherein said oxidizing agent is selected from the group consisting of phenols, peroxides, permanganates, chromates, iodates, iron salts, aluminum salts, sodium salts, potassium salts, phosphonium salts, chlorates, perchlorates, persulfates and mixtures thereof.

33. The composition of claim 29, wherein said abrasive particles are metal oxides.

* * * * *